(12) United States Patent
Ayazi et al.

(10) Patent No.: US 9,319,020 B2
(45) Date of Patent: Apr. 19, 2016

(54) TEMPERATURE COMPENSATION IN A SEMICONDUCTOR MICROMECHANICAL RESONATOR VIA CHARGE CARRIER DEPLETION

(75) Inventors: Farrokh Ayazi, Atlanta, GA (US); Ashwin Samarao, San Jose, CA (US)

(73) Assignee: Georgia Tech Research Corporation, Atlanta, GA (US)

( * ) Notice: Subject to any disclaimer, the term of this patent is extended or adjusted under 35 U.S.C. 154(b) by 504 days.

(21) Appl. No.: 13/276,931

(22) Filed: Oct. 19, 2011

(65) Prior Publication Data
US 2013/0099629 A1 Apr. 25, 2013

Related U.S. Application Data

(60) Provisional application No. 61/394,457, filed on Oct. 19, 2010.

(51) Int. Cl.
| | |
|---|---|
| *H03H 9/24* | (2006.01) |
| *H03H 3/013* | (2006.01) |
| *H03H 3/007* | (2006.01) |
| *H03H 9/02* | (2006.01) |
| *B81B 3/00* | (2006.01) |

(52) U.S. Cl.
CPC .......... *H03H 3/0076* (2013.01); *B81B 3/0081* (2013.01); *H03H 9/02448* (2013.01); *H03H 9/2463* (2013.01); *B81C 2201/0171* (2013.01); *H03H 2009/02496* (2013.01); *H03H 2009/2415* (2013.01)

(58) Field of Classification Search
CPC .......... H03H 9/02409; H03H 9/02448; H03H 9/2463; H03H 2009/02496; H03H 2009/2415; H03H 3/0076; H03H 3/013; B81B 3/0081; B81C 2201/0171

USPC ......... 333/186, 188, 197–200, 234; 310/308, 310/309; 257/28, 414, 415, 417, 418; 438/45, 50, 52, 57, 87, 381, 421, 510, 438/527, 529, 549

See application file for complete search history.

(56) References Cited

U.S. PATENT DOCUMENTS

| | | | | |
|---|---|---|---|---|
| 3,614,678 | A * | 10/1971 | Engeler et al. | 333/187 |
| 7,427,905 | B2 * | 9/2008 | Lutz et al. | 333/186 |
| 8,501,515 | B1 * | 8/2013 | Pan | 438/48 |
| 8,558,643 | B2 * | 10/2013 | Prunnila et al. | 333/186 |

(Continued)

OTHER PUBLICATIONS

A.K. Samarao et al.; "Intrinsic Temperature Compensation of Highly Resistive High-Q Silicon Microresonators via Charge Carrier Depletion"; 2010 IEEE International Frequency Control Symposium, Jun. 1-4, 2010, pp. 334-339 and IEEE abstract page.*

(Continued)

*Primary Examiner* — Barbara Summons
(74) *Attorney, Agent, or Firm* — Burns & Levinson LLP; Bruce D. Jobse (57) ABSTRACT

A semiconductor resonator has a substrate with a thickness extending between a first end and a second end and a pn-junction along the thickness of the substrate forming a free charge carrier depletion region. In another embodiment, a semiconductor resonator has a substrate with a crystal lattice doped at degenerate levels such that the flow of free charge carriers can be minimized. A method of compensating a temperature coefficient of a semiconductor resonator by creating a pn-junction based free charge carrier depletion region within a thickness of a substrate of the resonator is also disclosed.

18 Claims, 13 Drawing Sheets

(56) References Cited

U.S. PATENT DOCUMENTS

2006/0214202 A1* 9/2006 Zorich et al. ............... 257/294
2009/0096548 A1* 4/2009 Hopper ...................... 333/186
2010/0127596 A1* 5/2010 Ayazi et al. ................ 310/300
2011/0050366 A1* 3/2011 Ayazi et al. ................ 333/187
2012/0286903 A1* 11/2012 Prunnila et al. ............ 333/234

OTHER PUBLICATIONS

A.K. Samarao et al.; "Passive TCF Compensation in High Q Silicon Micromechanical Resonators"; 2010 IEEE 23rd International Conference on Micro Electro Mechanical Systems (MEMS), Jan. 24-28, 2010, pp. 116-119 and IEEE abstract page.*

* cited by examiner

TEMPERATURE COMPENSATION IN A SEMICONDUCTOR MICROMECHANICAL RESONATOR VIA CHARGE CARRIER DEPLETION

CROSS-REFERENCE TO RELATED APPLICATIONS

This application claims priority to and benefit of U.S. Provisional Patent Application No. 61/394,457, filed on Oct. 19, 2010, and entitled Temperature Compensation in Silicon Micromechanical Resonators via pn-Junction Based Free Charge Carrier Depletion, the contents of which are incorporated by reference in their entirety and for all purposes.

STATEMENT REGARDING FEDERALLY SPONSORED RESEARCH OR DEVELOPMENT

This invention was made partially with U.S. Government support from National Science Foundation under grant ECS-0348286. The U.S. Government may have certain rights in the invention.

FIELD OF THE INVENTION

The present disclosure relates to silicon micromechanical resonators, and, more specifically, to techniques for reducing the temperature coefficient of frequency for silicon micromechanical resonators.

BACKGROUND OF THE INVENTION

The uncompensated temperature coefficient of frequency (TCF) for a native silicon resonator is on the order of −30 ppm/° C., which is far greater than that of quartz resonators. To achieve stable low-phase-noise frequency references, the TCF needs to be compensated without compromising on the quality factor (Q) of the resonator. Circuit-based compensation techniques add to the power budget whereas depositing compensating materials with positive TCF on silicon is impractical on certain resonator geometries and may reduce the Q of the resonator.

Accordingly, there is a need for compensating the TCF of silicon micromechanical resonators without compromising on the quality factor of such resonators.

SUMMARY OF THE INVENTION

The present disclosure is directed towards compensating the temperature coefficient of silicon micromechanical resonators without compromising on the quality factor of such resonators. To achieve temperature compensation in silicon micromechanical resonators, the flow of free charge carriers in response to the propagation of acoustic waves in a silicon micromechanical resonator needs to be minimized. The flow of free charge carriers can be minimized by degenerate doping of the silicon micromechanical resonator or by lightly doping the silicon micromechanical resonator to create a pn-junction based free charge carrier depletion region.

According to one aspect of the present disclosure, a semiconductor resonator, comprises a substrate having a thickness extending between a first end and a second end and a pn-junction along the thickness of the substrate forming a free charge carrier depletion region.

According to another aspect, a semiconductor resonator comprises a substrate having a crystal lattice doped at degenerate levels.

According to another aspect, a method of compensating a temperature coefficient of a semiconductor resonator, comprises providing a substrate and creating a pn-junction based free charge carrier depletion region within a thickness of a substrate of the resonator.

The needs set forth herein as well as further and other needs and advantages are addresses by the present embodiments, which illustrate solutions and advantages described below. Various embodiments of the system and method are described in detail below and are also part of the present teachings.

BRIEF DESCRIPTION OF THE DRAWINGS

The present disclosure is illustratively shown and described in reference to the accompanying drawing in which.

DETAILED DESCRIPTION

Technologies herein are directed towards compensating the temperature coefficient of silicon micromechanical resonators without compromising on the quality factor of such resonators. To achieve temperature compensation in silicon micromechanical resonators, the flow of free charge carriers in response to the propagation of acoustic waves in a silicon micromechanical resonator needs to be minimized. The flow of free charge carriers can be minimized by degenerate doping of the silicon micromechanical resonator or by lightly doping the silicon micromechanical resonator to create a pn-junction based free charge carrier depletion region.

The present disclosure will be more completely understood through the following description, which should be read in conjunction with the drawings. In this description, like numbers refer to similar elements within various embodiments of the present disclosure. Within this description, the claims will be explained with respect to embodiments. The skilled artisan will readily appreciate that the methods, apparatus and systems described herein are merely exemplary and that variations can be made without departing from the spirit and scope of the disclosure.

Figure 1:
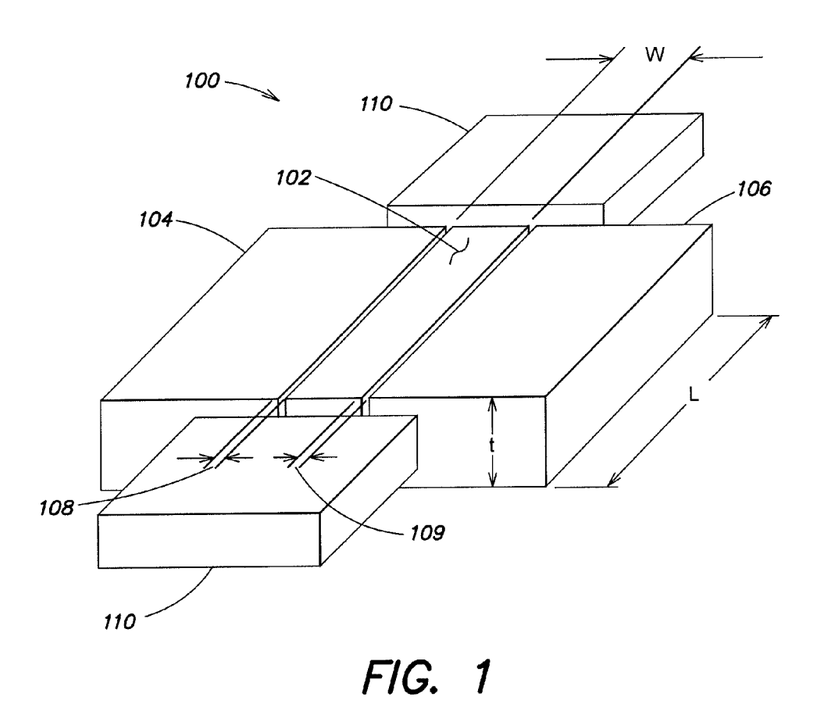
FIG. 1 illustrates a perspective conceptual view of a SiBAR (silicon bulk acoustic resonator) device according to various embodiments of the present disclosure.

Referring now to the drawings, FIG. 1 illustrates a perspective conceptual view of a SiBAR (silicon bulk acoustic resonator) device according to various embodiments of the present disclosure. In particular, a Silicon Bulk Acoustic Resonator (SiBAR) device 100 includes a resonator body or SiBAR 102, which includes a substrate having a thickness that extends between a first end and a second end. The SiBAR is supported symmetrically by two thin tethers (not shown) on the sides and separated from a drive electrode 104 by a capacitive gap 108 and a sense electrode 106 by a capacitive gap 109 respectively. The device 100 includes a pair of voltage pads 110, which can apply a DC polarization voltage (Vp) between the SiBAR 102 and the electrodes 104, 106 generating an electrostatic field in the narrow capacitive gaps 108. When an AC voltage is applied to the drive electrode 104, the electrostatic force applied to the corresponding face of the SiBAR 102 induces an acoustic wave that propagates through the SiBAR 102, resulting in a width-extensional resonance mode whose frequency is primarily defined by the width W of the SiBAR 102. Small changes in the size of the capacitive gap 109 on the other side of the SiBAR 102 induce a voltage on the sense electrode 106 whose amplitude peaks at the mechanical resonant frequency.

Resonance modes like the width-extensional mode of the SiBAR 102 involve the propagation of longitudinal waves through the bulk of the resonating body 102. The Young's modulus (E) that determines the elastic resonance frequency possesses a negative temperature coefficient. This results in the material softening which causes the stiffness, and thereby, the frequency of the SiBAR 102 to decrease with increasing temperature. Though the linear thermal expansion coefficient (a) of silicon also contributes to the TCF, its contribution is negligible compared to the temperature coefficient of Young's modulus (TCE). In the past, temperature compensation techniques have been used to combat the effect of TCE. The present disclosure, however, relates to target the TCE to achieve temperature compensation.

An acoustic wave propagating through a semiconducting resonator body, such as the SiBAR 102 induces a flow of free charge carriers by distorting the valence and conduction bands. For example, the valence band in silicon consists of three bands of energy in k-space of which two of the energy surfaces are degenerate and are energetically favorable to contain almost all the holes. The strain produced by the propagation of acoustic waves through such a material momentarily splits the degenerate bands leading to a flow of holes from lower to higher energy levels. The amount of band splitting and the resulting flow of holes increases with temperature. The principle of conservation of energy requires that such a temperature dependant change in the electronic energy of the system manifest itself as a corresponding temperature dependant change in the elastic energy of the system, which causes a negative TCE, and thereby a negative TCF in silicon.

To minimize the effect of the momentary strain on the energy bands produced by the acoustic waves as described above, a relatively large permanent strain can be created in the SiBAR 102 by doping. For example, a boron dopant has a smaller radius than silicon and can bond strongly to only three of the four adjacent silicon atoms when diffused in a crystal lattice of silicon. Such an atomic arrangement produces a very strong shear strain in the silicon lattice, which leads to a large permanent separation of the degenerate valence bands forcing more of the holes to occupy the higher energy band. The additional band-splitting contributed by the propagation of acoustic waves or the rise in temperature as discussed before are now minimal in comparison, which serves to compensate the TCF of silicon resonators. At degenerate levels of boron doping, the acoustic wave can potentially be shielded entirely from the k-space contours of the valence band, which in turn, should completely compensate the TCE component of the TCF. A reduction in TCF from −29 ppm/° C. to −1.5 ppm/° C. can be achieved via such degenerate boron doping of the SiBAR 102.

Figure 2:
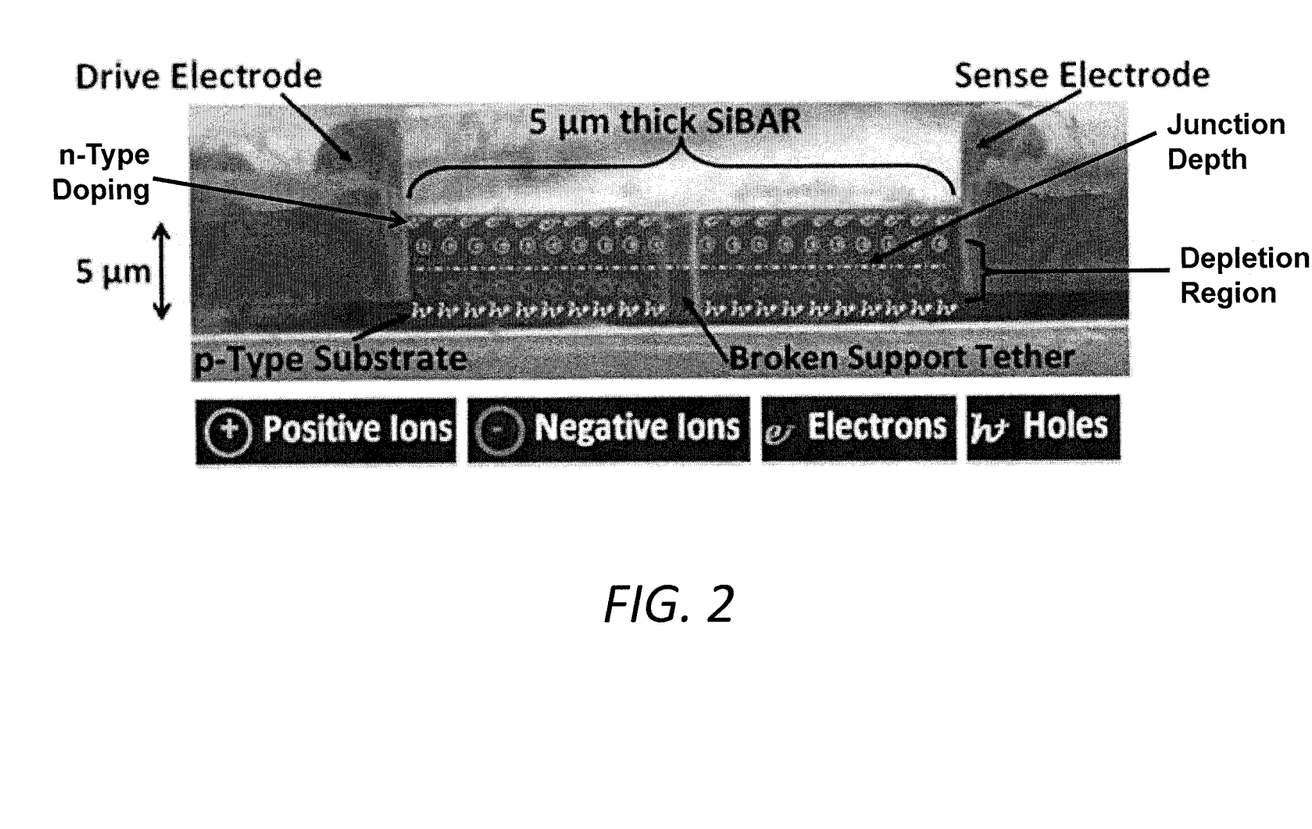
FIG. 2 illustrates an SEM image showing a pn-junction depletion region along the thickness of a SiBAR according to various embodiments of the present disclosure.

Another way to minimize the effect of the momentary strain on the energy bands produced by the acoustic waves, or in other words, to minimize the flow of free charge carriers in response to the propagation of acoustic waves in a micromechanical resonator is to deplete the resonator of free-charge carriers. This can be effected by creating a pn-junction along the thickness of the SiBAR 102, as shown in FIG. 2, which illustrates an SEM image showing a pn-junction depletion region along the thickness of a SiBAR. Wider pn-junction depletion regions can be realized by using lightly doped p-type and n-type regions. This translates to the usage of a high-resistivity (i.e., lightly doped) silicon substrate for realizing the micromechanical resonator and ensuing a light doping process with opposite type impurity to create as wide a depletion region as possible, along the thickness of the SiBAR. Thus, this technique offers the possibility of TCF reduction in silicon micromechanical resonator bodies fabricated on high resistivity substrates which are more commonly used in the semiconductor industry. Also, the lighter doping requirements of this technique may offer a very high throughput by significantly reducing the processing time as compared to the degenerative doping technique described above.

Figure 3:
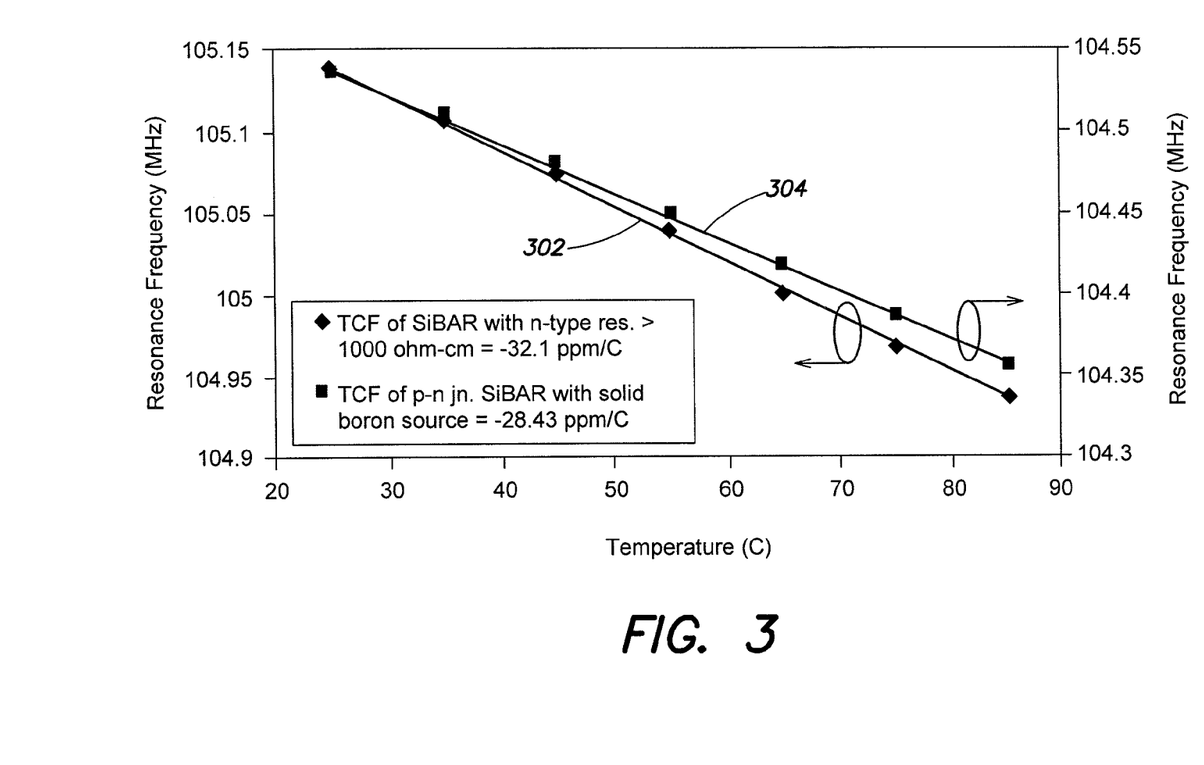
FIG. 3 illustrates a graph showing a measured reduction in TCF after creation of a pn-junction based charge depletion region in an n-type SiBAR with solid boron doping according to various embodiments of the present disclosure.

Referring now to FIG. 3, a graph showing a measured reduction in TCF after creation of a pn-junction based charge depletion region in an n-type SiBAR with solid boron doping is shown. In one embodiment, a 5 µm thick SiBAR fabricated on a phosphorous-doped n-type substrate with a resistivity>1000 Ω-cm has a starting TCF of −32.1 ppm/° C. This SiBAR's TCF is represented by plot 302. Plot 304 represents the TCF of a 5 µm thick SiBAR fabricated on a phosphorous-doped n-type substrate with a resistivity>1000 Ω-cm in which a free charge carrier depletion region with solid boron doping has been created. In the present embodiment, the pn-junction can be created by p-doping the n-type SiBAR with solid boron disks for 3 hours at 1450° C. followed by annealing at 1100° C. Although such a lighter doping process is expected to create a very wide depletion region, a reduction in TCF by only ~4 ppm/° C. is observed as shown in FIG. 3. Such a reduction in TCF demonstrates the possibility of TCF compensation via the creation of a charge depletion region. It should be noted that a reduction in TCF is accompanied by a small reduction in quality factor (Q) of the resonator from approximately 35,000 to approximately 28,000 in vacuum.

Figure 4:
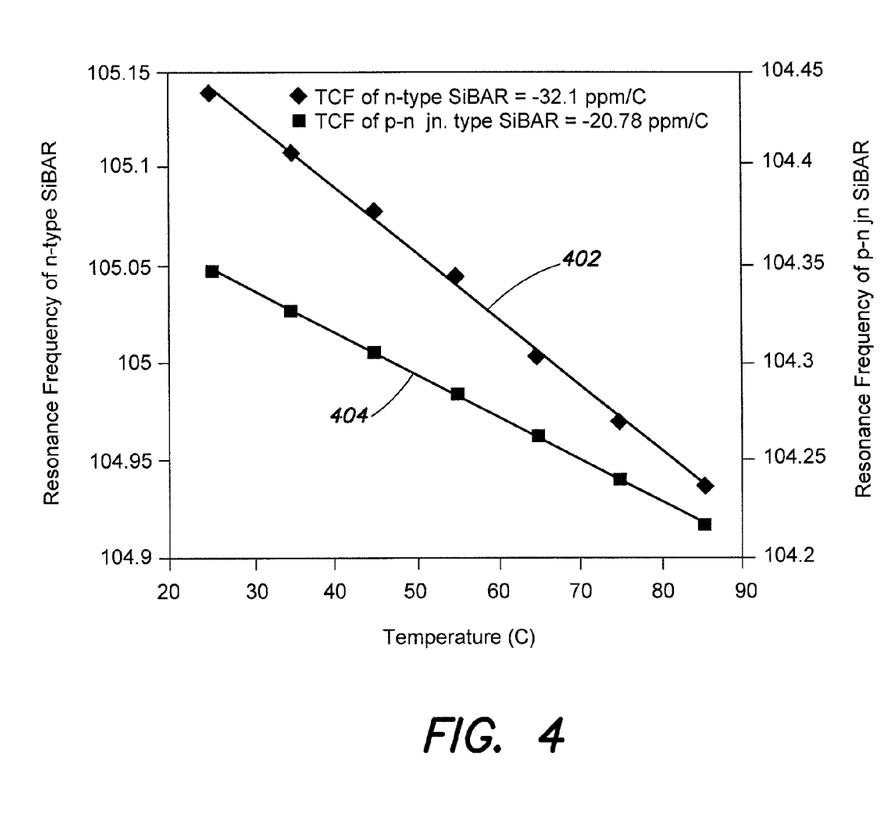
FIG. 4 illustrates a graph showing a measured reduction in TCF after creation of a pn-junction based charge depletion region in an n-type SiBAR with liquid boron doping according to various embodiments of the present disclosure.

However when such a boron doping is performed using spin-on liquid boron sources that can deposit a higher number of boron atoms on the substrate which can be driven-in deeper by an anneal process, a larger reduction in TCF is observed, as shown in FIG. 4. Referring now to FIG. 4, a graph showing a measured reduction in TCF after creation of a pn-junction based charge depletion region in an n-type SiBAR with liquid boron doping is shown. When boron is spun on a phosphorous doped n-type substrate with a resistivity of >1000 Ω-cm and subsequently annealed at 1100° C. for 6 hours, a reduction in TCF by 12 ppm/° C. from −32.1 ppm/° C. to −20.78 ppm/° C. is observed as shown in FIG. 4. In particular, plot 402 is the same plot shown in FIG. 3 as plot 302, while plot 404 represents the TCF of a SiBAR with a pn-junction based charge depletion region created using spin-on liquid boron sources.

It should be appreciated that the use of Boron as a dopant is an example, and the scope of the present disclosure is not intended to be limited to such examples. Rather, it should be appreciated by those skilled in the art that any suitable dopant may be utilized to create a free charge carrier depletion region. Similarly, the methods for doping a SiBAR disclosed herein are merely examples, and it should also be appreciated by those skilled in the art that other methods of doping a SiBAR may be implemented.

Figure 5A:
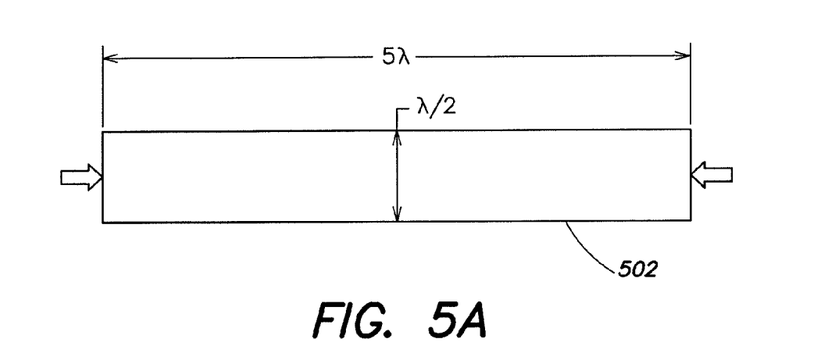
FIG. 5A is a top view schematic of a conventional SiBAR according to various embodiments of the present disclosure.
Figure 5B:
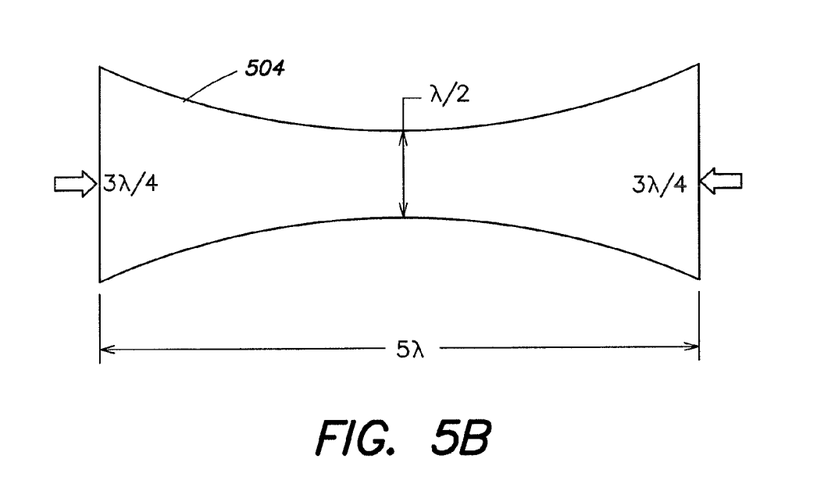
FIG. 5B is a top view schematic of a concave SiBAR (CBAR) according to various embodiments of the present disclosure.

According to aspects of the present disclosure, it has been determined that an additional reduction in TCF can be realized by employing a pn-junction based free-charge carrier depletion and modifying the geometry of the SiBAR. Referring now to FIGS. 5A and 5B, FIG. 5A is a top view schematic of a conventional rectangular-shaped SiBAR, while FIG. 5B is a top view schematic of a concave SiBAR (CBAR).

FIG. 5B illustrates a CBAR resonator body or CBAR 504 which can be realized by curving the long edges of the conventional rectangular SiBAR 502 shown in FIG. 5A such that the central width remains λ/2, but the CBAR 504 has wider flanks on either side. The flank width, when made exactly equal to 3λ/4, can act as a sink for the acoustic energy at the resonance frequency determined by the central width of λ/2.

Figure 6A:
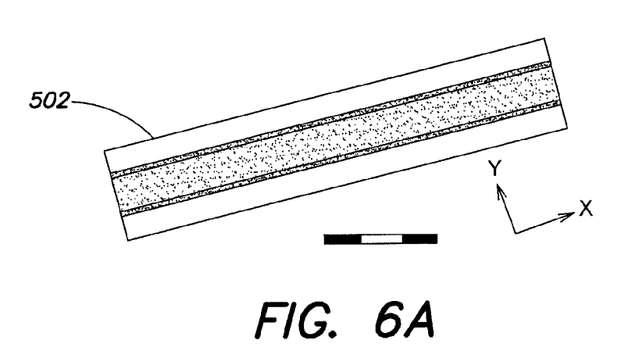
FIG. 6A illustrates an ANSYS simulated image of a width extensional mode shape of a conventional SiBAR device according to various embodiments of the present disclosure.
Figure 6B:
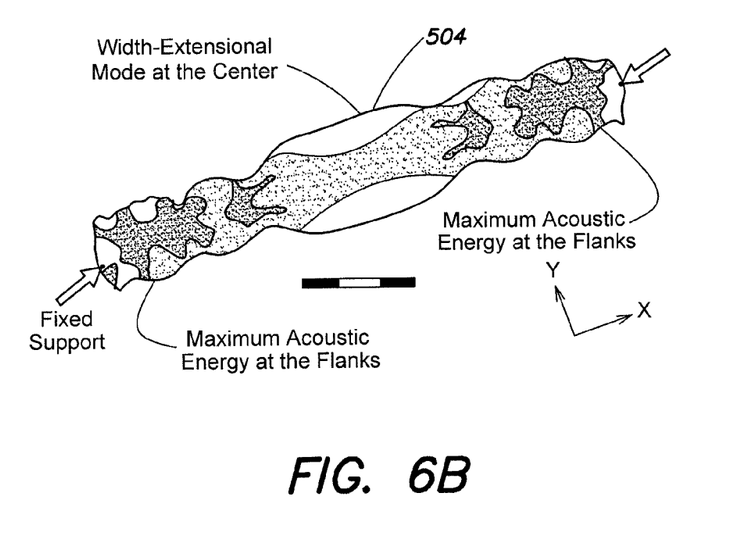
FIG. 6B illustrates an ANSYS simulated image of a width extensional mode shape of a CBAR device according to various embodiments of the present disclosure.

Referring now to FIGS. 6A and 6B, FIG. 6A illustrates an ANSYS simulated image of a width extensional mode shape of a conventional SiBAR, such as the rectangular SiBAR 502, and FIG. 6B illustrates an ANSYS simulated image of a width extensional mode shape of a CBAR, such as the CBAR 504. The curved design of a CBAR resonator body concentrates the acoustic energy near the central region thereby minimizing the acoustic loss at the narrow support elements and hence enhancing the Q of the resonator device.

Figure 7A:
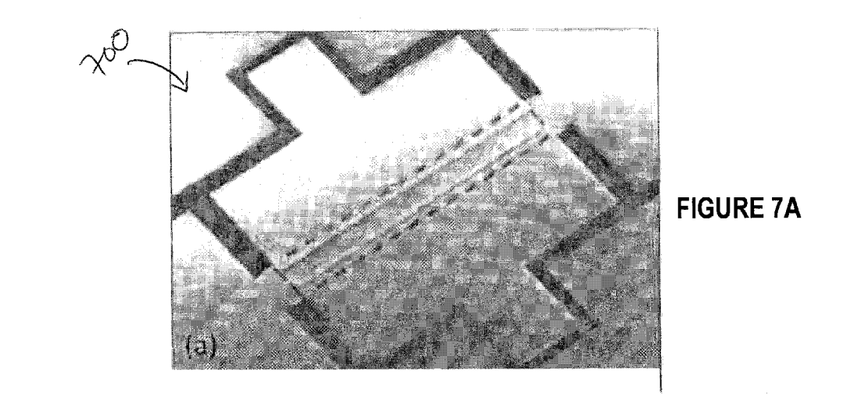
FIG. 7A illustrates an SEM image of a conventional SiBAR device according to various embodiments of the present disclosure.
Figure 7B:
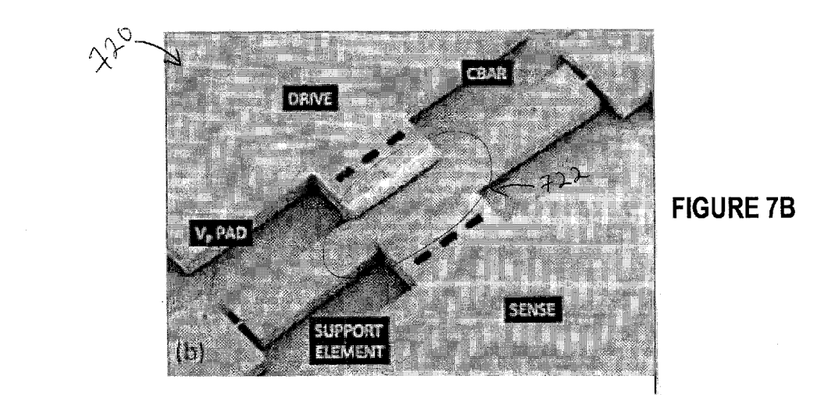
FIG. 7B illustrates an SEM image of a CBAR with 40 µm central width, 60 µm flank width, 20 µm thickness and 400 µm length according to various embodiments of the present disclosure.

Referring now to FIGS. 7A and 7B, FIG. 7A illustrates an SEM image of a conventional resonator device having a rectangular SiBAR and FIG. 7B illustrates an SEM image of a resonator device having a CBAR. Unlike in a conventional resonator device, such as the SiBAR resonator device 700, the drive/sense electrodes in a CBAR resonator device, such as the CBAR resonator device 720, may be positioned around the actively transduced central region 722, as shown in FIG. 7B.

In various embodiments, an undoped CBAR can offer a reduction in TCF by 13 ppm/° C. compared to that of a conventional undoped rectangular SiBAR. Such TCF variation can be attributed to the result of interaction between various types of acoustic waves in micromechanical resonators. Accordingly, CBAR resonator devices have relatively lower TCF values along with relatively higher Q values than conventional SiBAR resonator devices.

Figure 8:
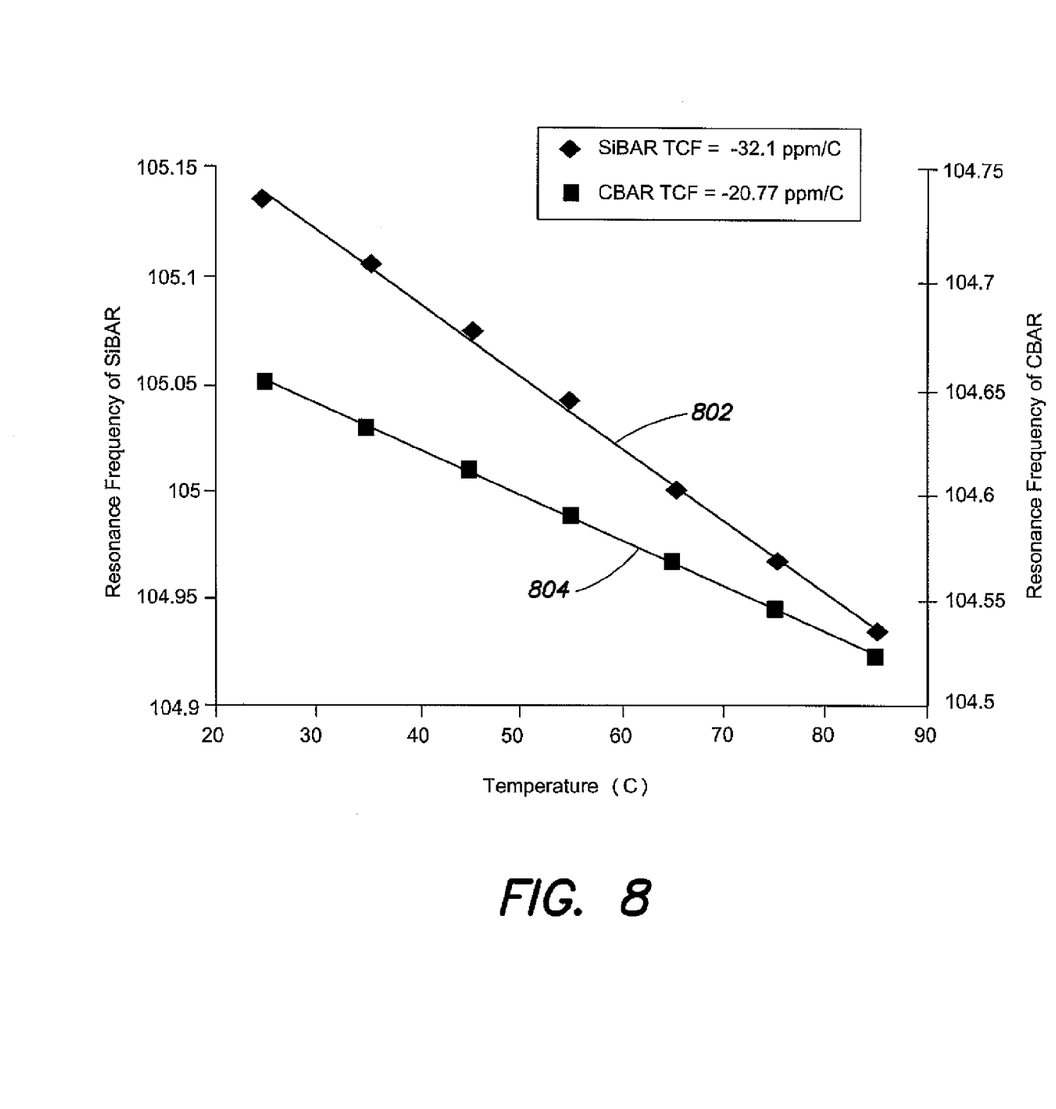
FIG. 8 illustrates a graph showing a measured reduction in TCF after creation of a pn-junction based charge depletion region in an n-type CBAR with liquid boron doping according to various embodiments of the present disclosure.

FIG. 8 illustrates a graph showing a measured reduction in TCF after creation of a pn-junction based charge depletion region in an n-type CBAR with liquid boron doping. In one embodiment, a 5 µm thick SiBAR fabricated on a phosphorous-doped n-type substrate with a resistivity>1000 Ω-cm has a starting TCF of −32.1 ppm/° C. as previously described with respect to FIG. 3. Plot 802 represents the TCF of such a resonator body. In contrast, the plot 804 represents the TCF of a CBAR fabricated on a 5 µm thick phosphorous-doped n-type substrate with resistivity>1000 Ω-cm. This CBAR can realize a reduction in TCF by 12 ppm/° C. compared to the conventional SiBAR as shown in FIG. 8. In addition, such a CBAR also offers a very high Q of at least approximately 75,000 in vacuum.

Figure 9:
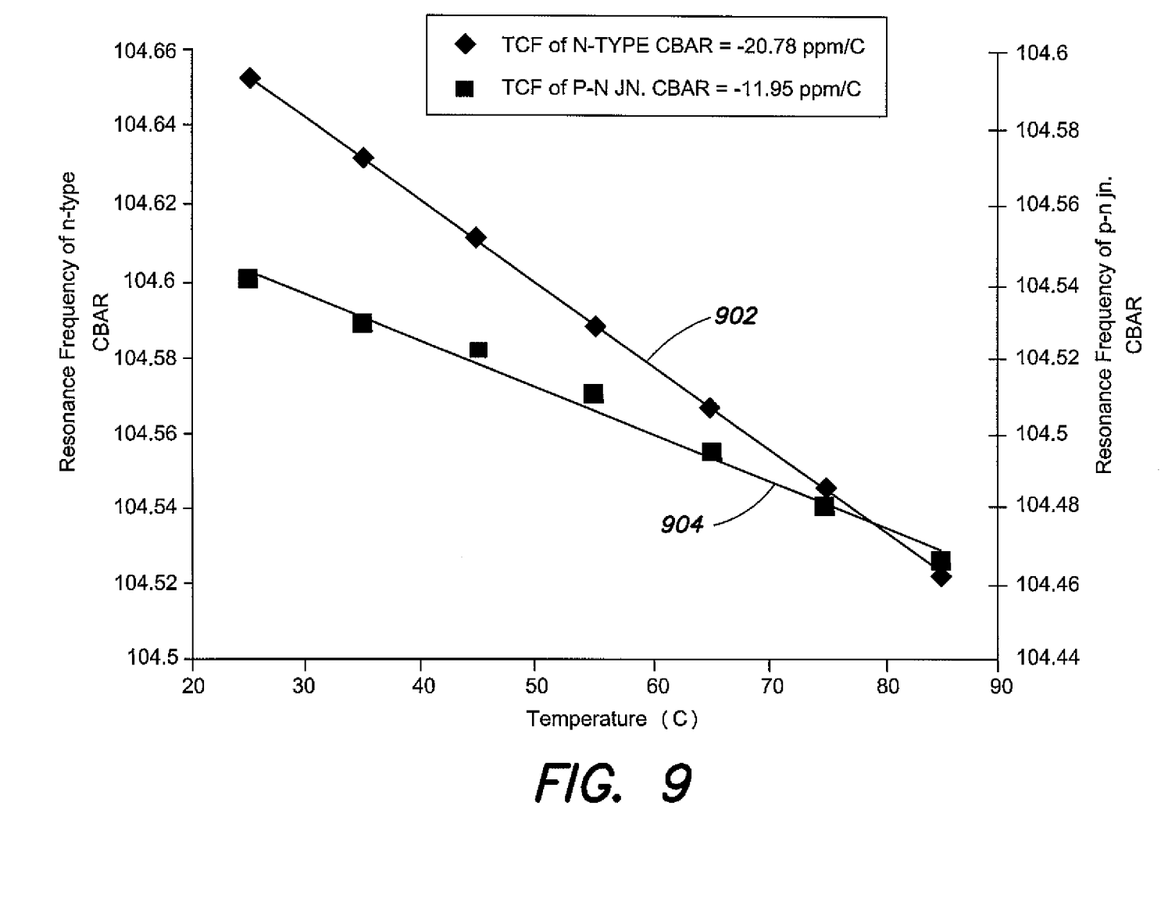
FIG. 9 illustrates a graph showing a measured TCF of SiBAR and CBAR fabricated on a phosphorous-doped n-type substrate with liquid boron doping according to various embodiments of the present disclosure.

The TCF of an undoped CBAR can be further reduced by creating a charge depletion region along its thickness by creating a pn-junction as illustrated before with respect to FIG. 2. By a similar p-type doping with liquid boron sources followed by annealing at 1100° C. for 6 hours as described above with respect to FIG. 4, the doped CBAR can yield a further reduction in TCF by 9 ppm/° C. from −20.77 ppm/° C. to −11.95 ppm/° C. FIG. 9 illustrates a graph showing a measured TCF of SiBAR and such a CBAR that is fabricated on a phosphorous-doped n-type substrate with liquid boron doping.

Figure 10:
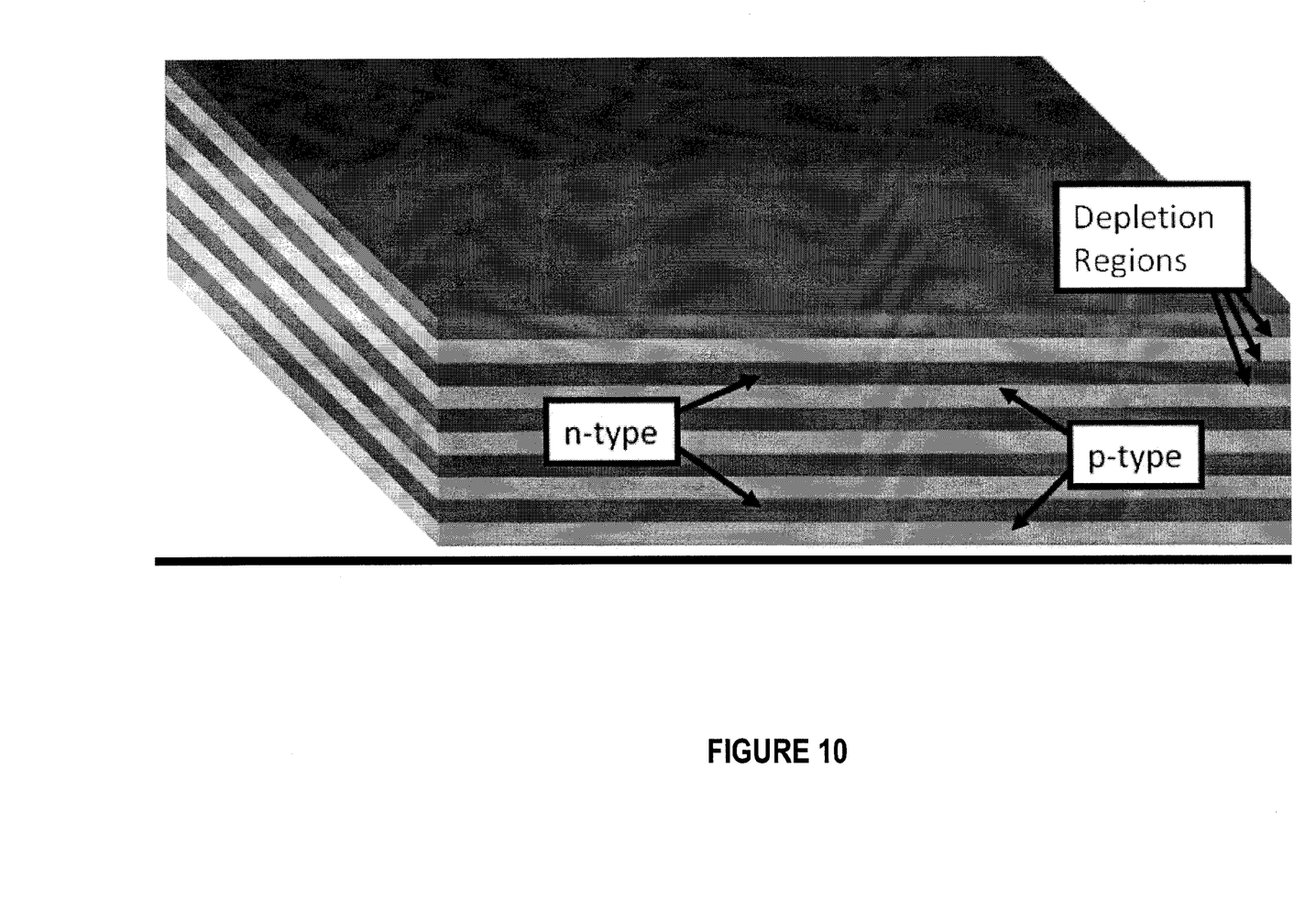
FIG. 10 illustrates a conceptual perspective view of a resonator having multiple pn-junctions created on a highly resistive p-type silicon substrate with consecutive doping with opposite polarity according to various embodiments of the present disclosure.

FIG. 10 illustrates a conceptual perspective view of a resonator having multiple pn-junctions created on a highly resistive p-type silicon substrate with consecutive doping with opposite polarity according to various embodiments of the present disclosure. In various embodiments, multiple pn-junctions can be stacked on top of each other in a starting silicon substrate by successively doping with opposing polarities of dopants with a progressive reduction in annealing time for every drive-in step. The multiple depletion regions that result may considerably deplete the free charge carriers. In various embodiments, multiple pn-junctions can be created using liquid phosphorous and boron dopants on a starting highly resistive n-type or p-type substrate. In one embodiment of fabricating such a resonator body, the first step involves phosphorous doping followed by annealing for 10 hours. This may be followed by boron doping and an annealing for 9 hours. Similarly, the dopant polarity may be reversed with every consecutive doping step while progressively reducing the duration of annealing by an hour, until the last step of boron doping is followed by one hour of annealing. Annealing may be performed at approximately 1100° C. for all these steps. The thickness of the different doped layers does not have to be equal. Such multiple pn-junctions were created on both 10 µm and 5 µm thick substrates.

Figure 11:
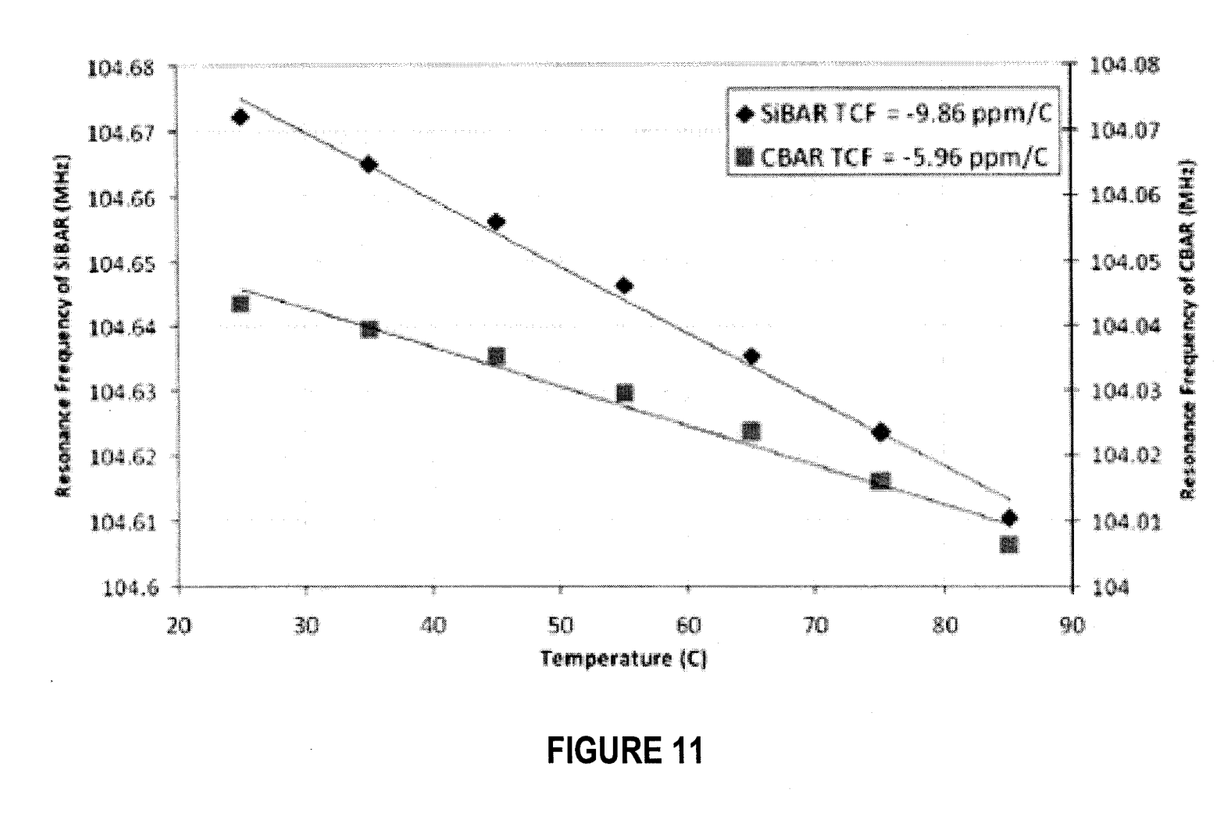
FIG. 11 illustrates a graph showing a measured TCF of SiBAR and CBAR fabricated on a 10 µm thick highly resistive silicon substrate with multiple pn-junctions according to various embodiments of the present disclosure.

FIG. 11 illustrates a graph showing a measured TCF of SiBAR and CBAR fabricated on a 10 µm thick highly resistive silicon substrate with multiple pn-junctions. The TCF of the SiBAR and CBAR on the 10 µm substrate was measured to be −9.86 ppm/° C. and −5.96 ppm/° C. respectively. Thus, the difference in the TCF reduces to just 3.9 ppm/° C. indicating the increasing independence of TCF on resonator geometry at increased depletion levels. In various embodiments, the Q of the SiBAR and CBAR have been measured to be 24,000 and 67,000 respectively, in vacuum at an input power level of −10 dBm and at a Vp of 10 V. The charge carriers might still not be appreciably depleted along the entire thickness of a 10 μm thick substrate, as the diffusion depths of doping processes are limited to 6-7 μm using liquid dopants.

Figure 12:
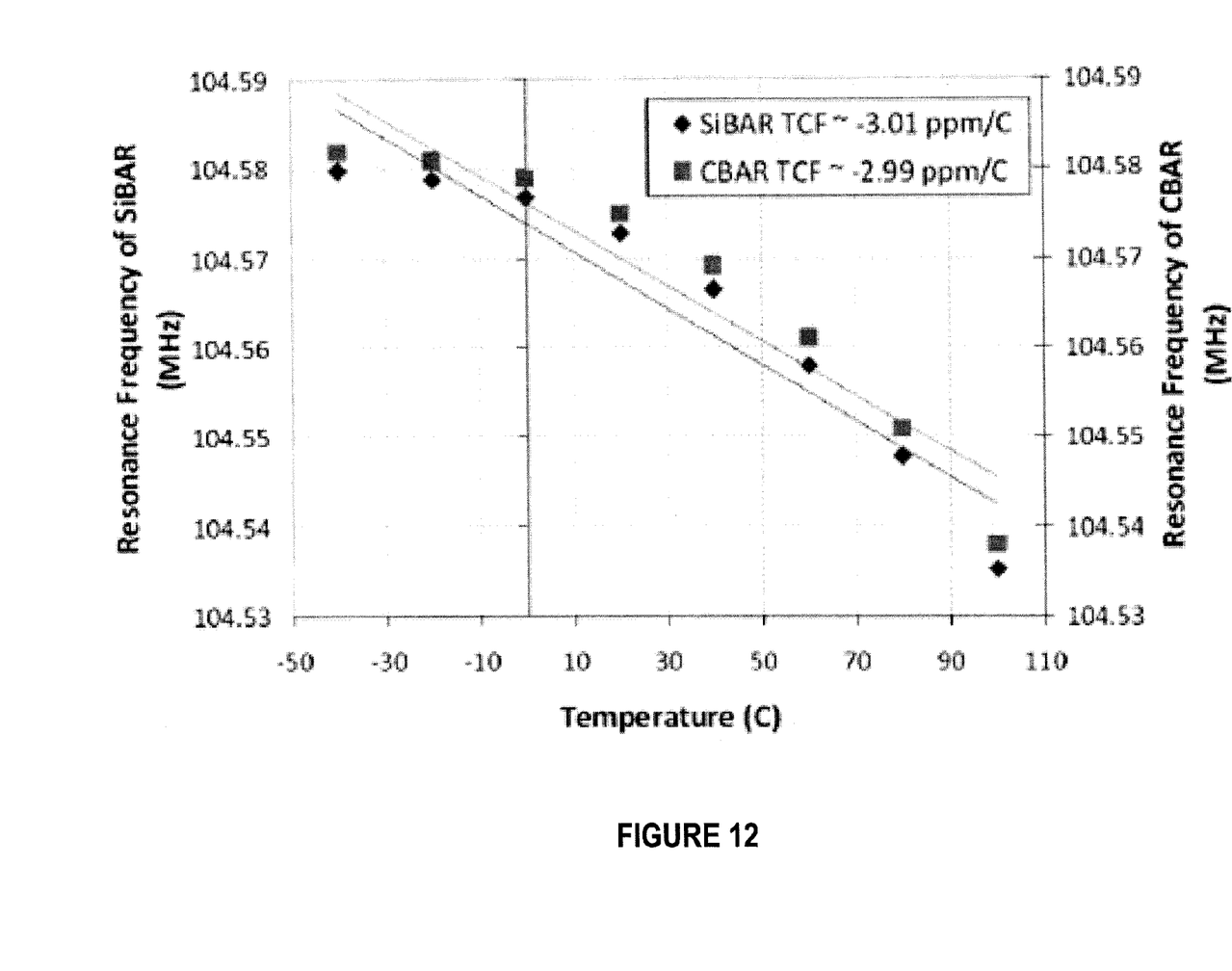
FIG. 12 illustrates a graph showing a measured TCF of SiBAR and CBAR fabricated on a 5 µm thick highly resistive silicon substrate with multiple pn-junctions according to various embodiments of the present disclosure.

FIG. 12 illustrates a graph showing a measured TCF of SiBAR and CBAR fabricated on a 5 μm thick highly resistive silicon substrate with multiple pn-junctions. At a substrate thickness of 5 μm, the TCF of the SiBAR and CBAR become equal and measure −3 ppm/° C. as shown by the plots in FIG. 12. Thus, the TCF is found to eventually become completely independent of the resonator geometry at very high depletion levels. As seen from FIG. 15, the linearity of the TCF curve is compromised to some extent with increasing levels of charge carrier depletion. Also, longer hours of annealing on a thin substrate degrade the Q of the resonators compared to the 10 μm substrate. In various embodiments, the Q of the SiBAR and the CBAR have been measured to be 13,000 and 50,000 respectively, in vacuum at an input power level of −10 dBm at a Vp of 10 V.

Figure 13:
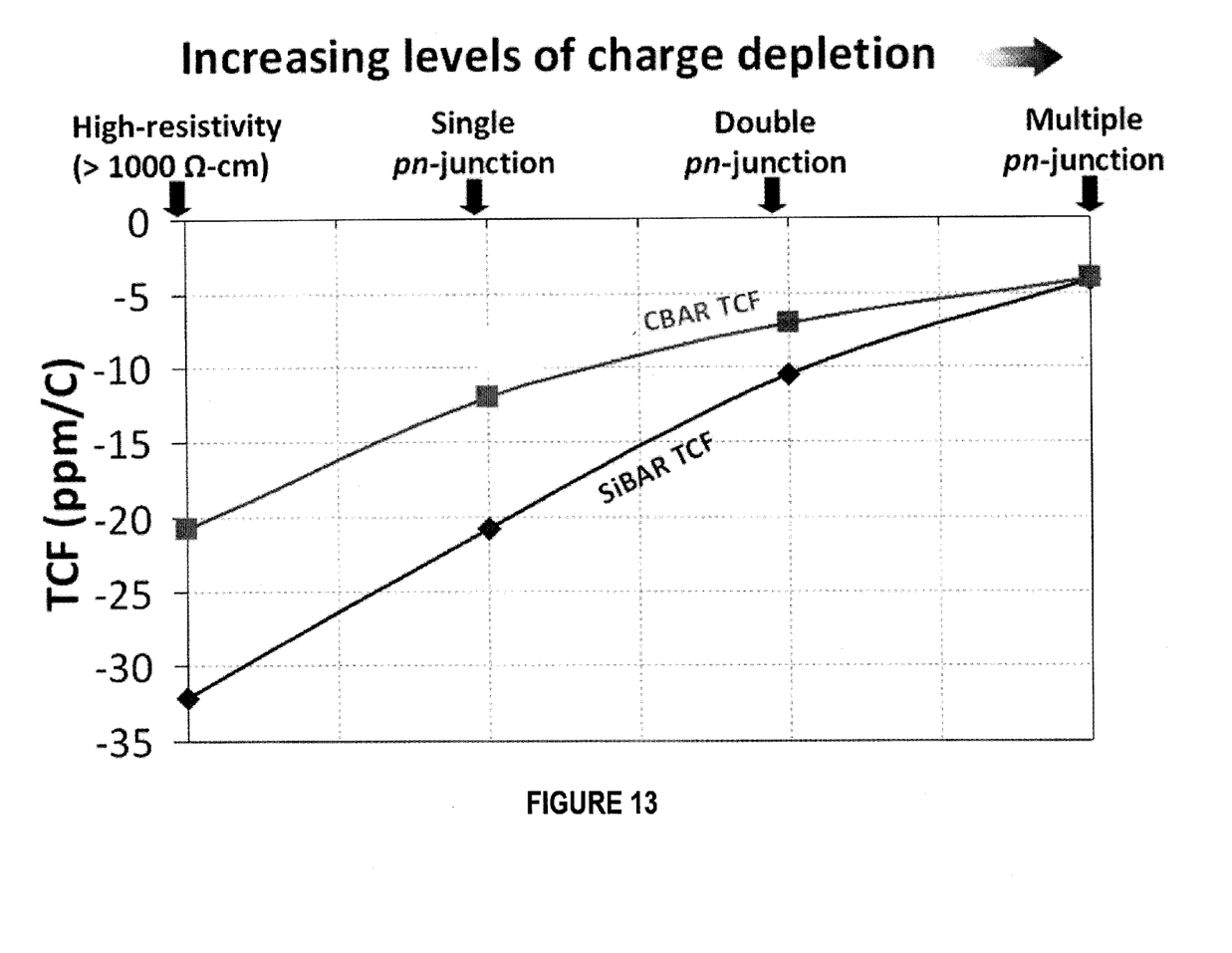
FIG. 13 illustrates a graph showing a measured TCF of the SiBAR and CBAR at very high depletion levels indicating the independence of TCF on the resonator geometry according to various embodiments of the present disclosure.

FIG. 13 illustrates a graph showing a measured TCF of the SiBAR and CBAR at very high depletion levels indicating the independence of TCF on the resonator geometry according to various embodiments of the present disclosure. The TCF of the SiBAR and CBAR were found to measure the same value at very high depletion levels indicating the independence of TCF on the resonator geometry. This indicates that the additional shear strain in a CBAR geometry during acoustic transduction effects a charge carrier based TCF compensation which becomes absent at such very high depletion levels. Furthermore, the longer hours of annealing involved in the creation of multiple pn-junctions can degrade the Q of the resonators. However, since the CBAR is designed for minimal support-loss and thereby a very high Q to start with, it can sustain a much higher Q compared to a SiBAR even after Q degradation.

The present disclosure is illustratively described above in reference to the disclosed embodiments. Various modifications and changes may be made to the disclosed embodiments by persons skilled in the art without departing from the scope of the present disclosure as defined in the appended claims.

What is claimed is:

1. A semiconductor resonator, comprising:
   a resonator body having a thickness extending between a first end and a second end; and
   a mechanism for reducing a temperature coefficient of frequency of the resonator comprising at least one pn-junction along the thickness of the resonator body forming a free charge carrier depletion region configured for minimizing a flow of free charge carriers therethrough.

2. The resonator of claim 1, wherein the resonator body comprises doped silicon.

3. The resonator of claim 1, wherein the resonator body is an n-type substrate.

4. The resonator of claim 1, wherein the resonator body is an n-type substrate doped with a p-type dopant.

5. The resonator of claim 1, wherein the resonator body is a phosphorous doped n-type substrate.

6. The resonator of claim 1, wherein the resonator body is doped with boron.

7. The resonator of claim 1, wherein the resonator body is a p-type substrate doped with an n-type dopant.

8. The resonator of claim 1, wherein the resonator body is doped with solid boron.

9. The resonator of claim 1, wherein the resonator body is doped using liquid boron.

10. The resonator of claim 1, wherein the resonator body comprises at least one of an n-type or p-type material lightly doped with the other of the n-type or p-type material.

11. The resonator of claim 1, wherein the resonator body is further defined by a pair of concave surfaces extending between the first and second ends thereof such that the resonator body is wider proximate the ends thereof and narrower proximate a center portion thereof.

12. The resonator of claim 11, wherein the center portion is approximately two thirds as long as the end regions of the resonator.

13. A semiconductor resonator, comprising:
    a resonator body having a thickness extending between a first end and a second end;
    a plurality of at least three pn-junction layers along the thickness of the resonator body forming a plurality of at least three free charge carrier depletion regions.

14. The resonator of claim 13, wherein the resonator body is further defined by a pair of concave surfaces extending between a first end and a second end thereof such that the resonator body is wider proximate the ends thereof and narrower proximate a center portion thereof.

15. A method of compensating a temperature coefficient of a semiconductor resonator, comprising:
    A) providing a resonator body having a thickness extending between first and second ends thereof;
    B) creating a pry-junction based free charge carrier depletion region along the thickness of the resonator body of the resonator.

16. The method of claim 15, wherein B) comprises B1) lightly doping the resonator body having at least one of an n-type or p-type material with the other of the n-type or p-type material.

17. The method of claim 16, wherein B1) comprises:
    B1a) doping a phosphorous doped n-type resonator body with a solid p-type dopant; and
    B1b) annealing the doped resonator body.

18. The method of claim 16, wherein B1) comprises:
    B1a) doping a phosphorous doped n-type resonator body with a liquid p-type dopant; and
    B1b) annealing the doped resonator body.

* * * * *

UNITED STATES PATENT AND TRADEMARK OFFICE
CERTIFICATE OF CORRECTION

PATENT NO. : 9,319,020 B2
APPLICATION NO. : 13/276931
DATED : April 19, 2016
INVENTOR(S) : Farrokh Ayazi et al.

Page 1 of 1

It is certified that error appears in the above-identified patent and that said Letters Patent is hereby corrected as shown below:

In the Claims

In column 8, line 40 (claim 15), "B) creating a pry-junction based free charge carrier depletion region along the thickness of the resonator body of the resonator." should read -- B) creating a pn-junction based free charge carrier depletion region along the thickness of the resonator body of the resonator. --

Signed and Sealed this
Twenty-first Day of June, 2016

Michelle K. Lee
*Director of the United States Patent and Trademark Office*